(12) United States Patent
Poechmueller

(10) Patent No.: US 7,325,182 B2
(45) Date of Patent: Jan. 29, 2008

(54) METHOD AND CIRCUIT ARRANGEMENT FOR TESTING ELECTRICAL MODULES

(75) Inventor: Peter Poechmueller, Dresden (DE)

(73) Assignee: Infineon Technologies AG, Munich (DE)

(*) Notice: Subject to any disclaimer, the term of this patent is extended or adjusted under 35 U.S.C. 154(b) by 248 days.

(21) Appl. No.: 11/073,814

(22) Filed: Mar. 7, 2005

(65) Prior Publication Data

US 2005/0216808 A1 Sep. 29, 2005

(30) Foreign Application Priority Data

Mar. 5, 2004 (DE) .................. 10 2004 010 783

(51) Int. Cl.
*G06F 11/00* (2006.01)
(52) U.S. Cl. .............. 714/738; 714/739; 714/736; 714/737
(58) Field of Classification Search ............ None
See application file for complete search history.

(56) References Cited

U.S. PATENT DOCUMENTS

| | | | | |
|---|---|---|---|---|
| 5,621,312 | A * | 4/1997 | Achor et al. ............ | 324/158.1 |
| 6,195,616 | B1 * | 2/2001 | Reed et al. ............. | 702/119 |
| 6,504,399 | B2 * | 1/2003 | Pani et al. ............. | 326/41 |
| 6,871,298 | B1 * | 3/2005 | Cavanaugh et al. ........ | 714/33 |
| 2002/0188903 | A1 * | 12/2002 | Chu et al. ............. | 714/738 |
| 2003/0065998 | A1 | 4/2003 | Rios-Baez | |
| 2003/0177423 | A1 * | 9/2003 | Komatsu et al. .......... | 714/700 |
| 2004/0163023 | A1 * | 8/2004 | Ishida et al. ........... | 714/738 |
| 2004/0181722 | A1 * | 9/2004 | Lee et al. .............. | 714/726 |
| 2005/0108599 | A1 * | 5/2005 | Huisman et al. .......... | 714/700 |
| 2005/0131665 | A1 * | 6/2005 | Ho et al. .............. | 703/14 |
| 2005/0149805 | A1 * | 7/2005 | Syed et al. ............. | 714/741 |
| 2005/0176376 | A1 * | 8/2005 | Liu .................... | 455/67.16 |
| 2005/0246613 | A1 * | 11/2005 | Blaauw et al. .......... | 714/763 |
| 2006/0020867 | A1 * | 1/2006 | Evans .................. | 714/742 |
| 2006/0031731 | A1 * | 2/2006 | Ishida et al. ........... | 714/738 |
| 2006/0041810 | A1 * | 2/2006 | Ishida et al. ........... | 714/738 |
| 2006/0224343 | A1 * | 10/2006 | Visser et al. ........... | 702/85 |

FOREIGN PATENT DOCUMENTS

JP 55054478 A 4/1980

* cited by examiner

*Primary Examiner*—Guy Lamarre
*Assistant Examiner*—Guerrier Merant
(74) *Attorney, Agent, or Firm*—Patterson & Sheridan, L.L.P.

(57) ABSTRACT

The invention relates to a method for testing electrical modules. A test pattern of input signals is applied to each module to be tested as test specimen, and the actual responses of the test specimen to the test pattern is compared with the desired responses. The comparison result is evaluated for the purpose of displaying test assessments. According to one embodiment of the invention, to supply the desired responses, a reference module produced with the same design and technology as the test specimen and tested as entirely satisfactory is utilized. The same test pattern as for the test specimen is applied to the reference module. The invention furthermore relates to circuit arrangements for carrying out this method, in particular for testing data memories.

16 Claims, 4 Drawing Sheets

METHOD AND CIRCUIT ARRANGEMENT FOR TESTING ELECTRICAL MODULES

CROSS-REFERENCE TO RELATED APPLICATIONS

This application claims foreign priority benefits under 35 U.S.C. §119 to co-pending German patent application number DE 10 2004 010 783.1-35, filed 5 Mar. 2004. This related patent application is herein incorporated by reference in its entirety.

BACKGROUND OF THE INVENTION

1. Field of the Invention

The invention relates to a method and a circuit arrangement for testing electrical modules. A preferred, but not exclusive, field of application for the invention is in electronic modules that are formed as integrated circuits on a semiconductor chip, in particular data memories. Thus, the invention relates, in a particular embodiment, to a data memory circuit specifically designed for an application of the test method according to the invention.

2. Description of the Related Art

Electrical modules are generally tested by a test pattern of input signals being applied to the modules as "test specimens" and output signals generated as a response to said input signals being compared with prescribed "desired" responses. The comparison results are then evaluated for the purpose of displaying the test assessment. If the discrepancies between the "actual" responses that appear and the assigned desired responses all lie within a selected tolerance range, the test is deemed to have been "passed" (test assessment "good"); otherwise, the test is deemed to have been "failed" (test assessment "poor" or "defective"). If desired, the comparison results can also be individually evaluated and logged, even quantitatively in each case, on the basis of the log, to perform a more accurate analysis of the behavior of the test specimen.

Tests of the type described are indispensable to a module manufacturer, in particular as final testing of the completed modules prior to the delivery thereof. Commercial test devices (referred to as "testers" for short) are usually used, which are programmable, to provide the respective desired responses for selected test patterns, to carry out the comparison of the actual responses with the desired responses and to predefine the criteria for the test assessments. Such testers are relatively complicated devices, and all the more expensive, the faster they operate. In the case of modules to be tested, such as memory modules, which are intended to operate at very high speeds (i.e., with very fast signal sequences) in their useful mode, the testers must also be correspondingly fast, of course, to carry out the test realistically. The clock frequencies for the useful mode of present-day memory modules are a few hundred MHz. Testers capable of precisely testing modules with such high frequencies currently cost several million euro or US dollars.

Since a tester can only test a small number of modules in parallel on account of limited resources, the supply from mass fabrication of electrical modules can currently be handled only if a plurality of testers are available simultaneously. This applies both to the case of a large supply from a series of identical modules, the multiplicity of testers operating with identical programming, and to the case where different series of modules are manufactured in parallel, each series demanding its own test program. Consequently, this gives rise to relatively high capital expenditure which a module manufacturer has to spend on test devices, relative to the number of modules to be tested.

Therefore, there is a need to reduce the equipment outlay for the testing of series of electrical modules without reducing the accuracy and reliability of the tests.

SUMMARY OF THE INVENTION

Accordingly, one embodiment of the invention is realized in a method for testing electrical modules, a test pattern of input signals being applied to each module to be tested as test specimen and the actual responses of the test specimen to the test pattern being compared with the desired responses and the comparison result being evaluated for the purpose of displaying test assessments. According to one embodiment of the invention, to supply the desired responses, a reference module that is produced with the same design and technology as the test specimen and tested as entirely satisfactory is utilized, wherein the same test pattern as that for the test specimen is applied to the reference module.

In one embodiment, a circuit arrangement for testing electrical modules comprises a device for generating a preselected test pattern of input signals for each test specimen, a comparison device for comparing the actual responses to the test pattern that are supplied by the test specimens with assigned desired responses, and an evaluation device, connected to the comparison device, for supplying test assessments in a manner dependent on the comparison results. A reference module comprising the circuit arrangement is produced with the same design and technology as the test specimens and tested as entirely satisfactory. The reference module is arranged for the purpose of receiving the preselected test pattern to supply the desired responses.

Embodiments of the invention provide the advantage that a tester which operates in a precise manner and is expensive need only be used to find, for each module series, just a single module which operates in an ideal manner (or only a few such modules), which can then serve as a reference module, that is to say, as a model for the tests of all the other modules (or in each case of a multiplicity of the other modules) in the series. The expensive tester is thus not required during the series tests and can be used for a different purpose, if desired. This reduces the test device outlay and hence the test costs per test specimen.

Embodiments of the invention may be employed for testing electrical modules of arbitrary type, i.e., the test specimens may be analog circuits or digital circuits. For testing digital circuits such as digital memory modules, controllers or other data-processing circuits, it may suffice to test the signals supplied by the test specimens with regard to "logical correctness". This correctness exists if the signal represents the respectively desired logic value (e.g., the binary value "0" or "1"). Therefore, testing the logical correctness necessitates only a simple logic value comparison between each actual response supplied by the test specimen and the assigned desired response supplied by the reference module.

However, it may also be desirable to test the so-called "integrity" (physical correctness) of the signals supplied by the test specimens, i.e., the form fidelity of the temporal profile of the signals. Testing the form fidelity of the signals is not only expedient when testing analog circuits but is also gaining increasing importance for testing digital modules. Even present-day digital modules operate at frequencies that are close to the limit of what can be handled by transmission lines. Thus, small deviations in the signal form of the output signal of a digital module (e.g., in the edge steepness or in the peak voltage of a data pulse) may have the effect that the signal is no longer reliably identified at the end of a transmission link even though it appears "logically correctly" at the output of the module. This may lead to malfunctions of an overall system in which the relevant module is inserted. Since the commercial testers available nowadays for digital circuits can only test the logical correctness, such malfunctions can only be found by performing tests within the overall system, that is to say, on the system board or motherboard after the module has been inserted into the system (so-called "motherboard" test). This is disadvantageous because a module identified as defective has to be separated from the system again and replaced by a new module.

In a particular embodiment of the invention, measures are taken to test the physical integrity of the output signals of the test specimens. For this purpose, the test comparison is evaluated on the basis of the time integral of the magnitude of the amplitude difference between actual response and desired response. The time integral is a measure of the extent to which a signal supplied by the test specimen deviates from the desired profile form. The test assessment "test not passed" may be displayed if the value of the specific time integral determined is higher than a preselected threshold value. The threshold value may be an empirical value and may be found, for example, as a result of a few preliminary experiments by means of the conventional motherboard tests. If only those modules which have passed the test with the threshold value found are inserted into the overall system, the probability of malfunctions of the overall system is significantly lower.

The invention's principle of using an exemplary reference module as the desired response transmitter may be applied particularly advantageously to the testing of digital memory circuits. In memory tests, the test pattern comprises a pattern of data bits which are written to addressed memory cells via data terminals of the memory circuit. The "responses" to the test pattern are the data signals that are output when reading from the memory cells at the data terminals. As will be explained in more detail further below, the principle according to the invention permits an economical and cost-saving implementation of such memory tests, in particular, and also opens up the possibility of making memory circuits testable more economically than heretofore.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The invention relates to a method and a circuit arrangement for testing electrical modules. Unless defined in greater detail, the general term "module" here is taken to mean electrical circuits or assemblies of any desired type. A preferred, but not exclusive, field of application for the invention is in electronic modules that are formed as integrated circuits on a semiconductor chip, in particular data memories. One particular embodiment provides a data memory circuit specifically designed for an application of the test method according to the invention.

Figure 1:
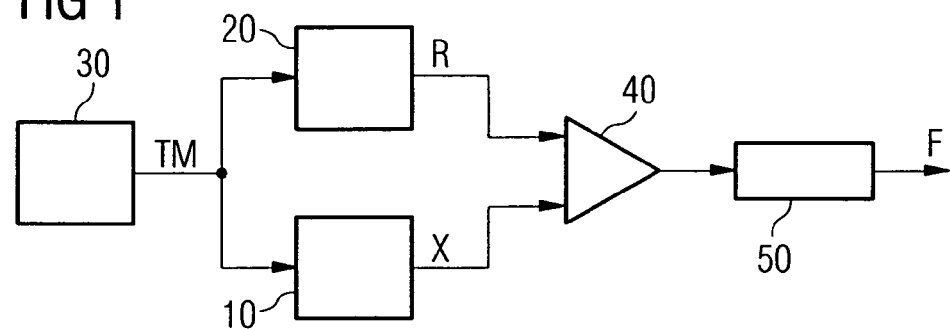
FIG. 1 illustrates the principle of the invention in the form of a block diagram.

In FIG. 1, the block 10 symbolizes a "test specimen", that is to say, an electrical module to be tested, which may be of arbitrary type and the useful function of supplying respectively prescribed output signals as a response to defined input signals. To test whether or to what extent the test specimen 10 correctly fulfills this function, a test pattern TM of input signals is applied to the test specimen 10. The test pattern is generated by a test pattern generator 30 and is typical of the input signal patterns such as those occurring during useful operation of the test specimen 10.

The block 20 symbolizes a "reference module", which resembles the test specimen 10 insofar as it is produced with the same design and the same technology, and may also originate from the same series, as the test specimen. In contrast to the test specimen 10, the reference module 20 is an exemplar module which can be definitely assumed to operate reliably and correctly, that is to say, to supply the prescribed "desired" responses R to the test pattern TM. Such an exemplar module can be found by means of a precision tester.

The test pattern TM generated by the test pattern generator 30 is simultaneously applied to the test specimen 10 and to the reference module 20, and the signals X which appear at the output of the test specimen as the actual response are compared, in a comparator 40, with the signals R which appear at the output of the reference module and which represent the desired responses to the test pattern TM. The comparison result from the output of the comparator 40 is processed in an evaluation circuit 50 to derive a display signal. If the test specimen 10 (and thus also the reference module 20) is an analog module, then an analog comparator is used as the comparator, and the evaluation circuit may be, in a simple case, a threshold detector that supplies an error signal F as display signal if the magnitude of the comparison result exceeds a preselected threshold value. If the test specimen 10 is a digital module whose output signals represent logic values, then the comparator and the evaluation circuit may be formed, in a simple case, by a logical comparator, e.g., by a modulo-2 adder, which supplies an error signal F if the compared logic values do not correspond.

Figure 2:
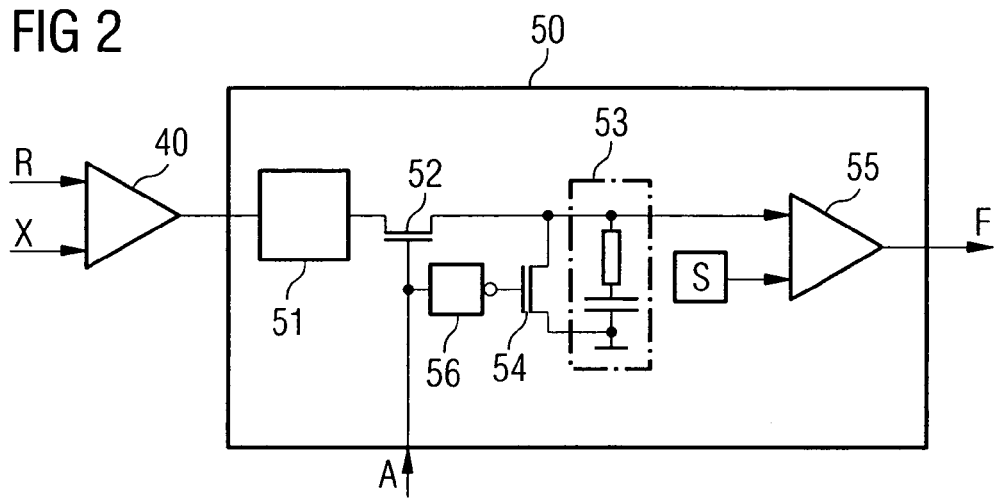
FIG. 2 shows an embodiment of a circuit for evaluating the comparison between actual response and desired response of a test.

In an embodiment illustrated in FIG. 2, the comparator 40 and the evaluation circuit 50 are formed in such a way as to supply a display signal which provides information about the physical integrity of the actual responses X of the test specimen 10. In the case shown, the comparator 40 is an analog amplitude comparator that supplies the amplitude difference Δ(t) between the temporal profile X(t) of the actual responses of the test specimen 10 and the temporal profile R(t) of the desired responses. The magnitude |Δ(t)| of said amplitude difference is formed in a block 51 within the evaluation circuit 50. As an alternative, the amplitude comparator 40 may be configured in a manner known in the art such that it forms the signal |Δ(t)| itself.

The evaluation circuit 50 contains an activation switch, which is shown as N-FET 52 and can be turned on by a high level of an activation signal A to apply the signal |Δ(t)| to an integrator 53 for the duration of this activation, said integrator being illustrated as a simple RC element in FIG. 2. A clear switch shown as N-FET 54 is arranged in parallel with the integrator 53 and is controlled by the signal A via an inverter 56, so that it is in the off state whenever and only when the activation switch is in the on state.

Figure 3:
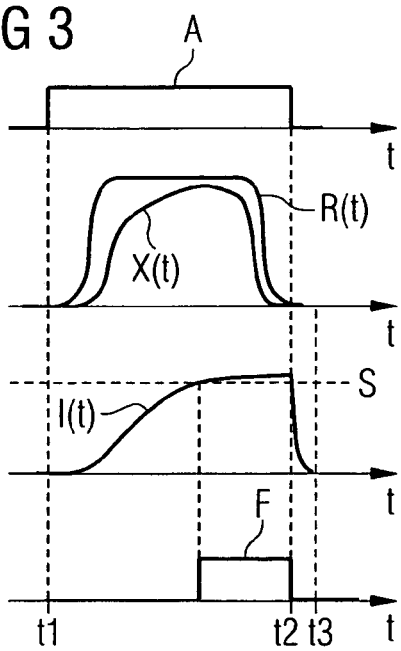
FIG. 3 shows timing diagrams of signals in the circuit according to FIG. 2.

The mode of operation of the evaluation circuit 50 according to FIG. 2 is illustrated in the timing diagrams according to FIG. 3 for the illustrative case where the test specimen 10 and the reference module 20 generate data pulses as responses to a test pattern. The desired response R supplied by the reference module is a voltage pulse having steep leading and trailing edges and a flat pulse crest, while the voltage pulse supplied by the test specimen as actual response X begins in somewhat delayed fashion, rises more slowly, and has a rounded crest of reduced amplitude. The instants t1 and t3 mark a time window within which a response may appear, e.g., the limits of a data clock period. At the instant t1, the activation signal A is activated (switched to a high level), so that the switch 52 is turned on and the switch 54 is turned off. At an instant t2 shortly before t3, the activation signal A is deactivated, so that the switch 52 is turned off and the switch 54 is turned on. Consequently, there builds up at the integrator 53, starting from the instant t1, a voltage Vi(t) which is proportional to the current time integral of the magnitude of the amplitude difference between the actual response X(t) of the test specimen 10 and the desired response R(t) supplied by the reference module 20, starting from the instant t1:

$$Vi(t) = K \int_{t1}^{t} |R(t) - X(t)| dt,$$

where K is a circuit-specific proportionality constant which depends on the dimensioning of the gain factor of the comparator 40 and the circuit components of the evaluation circuit and is readily reproducible. The current time integral rises monotonically, corresponding to the growth in the area enclosed between the curves X(t) and R(t). The time integral is applied to a threshold detector 55, which supplies an error signal F having a high level as soon as the current integral exceeds a set threshold value S. At the instant t2, the integrator 53 is "cleared" again, i.e., reset to zero, via the turned-on switch 54. If the time integral has not reached the threshold value S by then, an effective error signal F is not generated. The whole procedure starts anew at the instant t3, with the beginning of the clock period for the next test pattern response.

Instead of a single test specimen 10, it is also possible for a plurality of test specimens of the same series to be connected to the test pattern generator 30 to synchronously test a plurality of test specimens simultaneously. In this case, a corresponding number of comparators 40 are to be provided, each of which is connected to the reference module 20 and to a respective one of the test specimens and in each case impinges on a dedicated evaluation circuit 50.

Instead of a single common test pattern generator 30, a dedicated test pattern generator may be provided in each case for the reference module 20 and the test specimen 10 or for each test specimen 10. All the generators supply the same test patterns synchronously. The test pattern generators may be integrated in the modules to be tested and in the reference module. Many types of data-processing modules, such as memory modules, are produced with integrated test pattern generators which can also be utilized for the test principle according to the invention. As an example, FIG. 4 shows an arrangement for testing a plurality of test specimens with integrated test pattern generators in parallel according to the principle of the invention.

Figure 4:
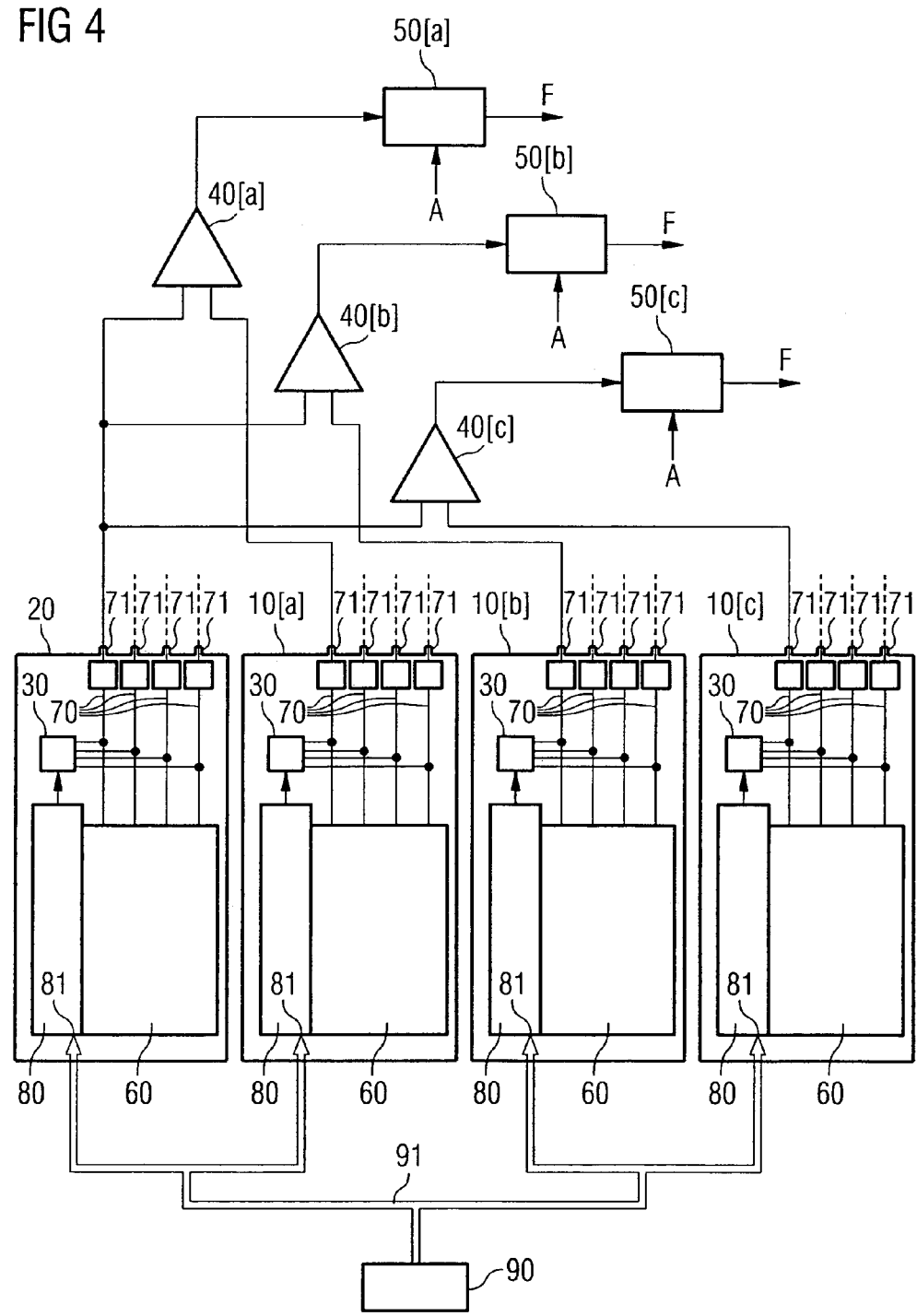
FIG. 4 shows the schematic diagram of a circuit arrangement for carrying out memory tests according to a first embodiment of the invention.

Three identical test specimens 10[a], 10[b], 10[c] are inserted in the arrangement according to FIG. 4. The test specimens are memory modules, e.g., DRAM modules, which are in each case integrated on a chip and are in a preferred field of application of the invention. Each of the test specimens 10[a:c] contains an array 60 with a multiplicity of memory cells and a plurality of bidirectional data ports 70 connected to respectively assigned external data terminals 71 to transmit externally received data bits from the terminals 71 to addressed memory cells of the cell array 60 in the write mode and to transmit the data signals obtained during read-out at addressed memory cells to the data terminals 71 in the read mode. The write and read modes and the addressing of the memory cells are controlled by an internal control device 80 in a manner dependent on external command and address information which overall comprises a multiplicity of parallel bits (command bits and address bits) and is applied to a control input 81. FIG. 4 depicts n=4 data terminals at each test specimen 10 as an example, during each memory clock cycle, to write in or read out n data bits in parallel at an addressed group of n memory cells. In practice, n is usually higher and is usually an integer to the power of 2.

Each test specimen 10 shown in FIG. 4 further contains a dedicated internal test pattern generator 30 which may be activated by the control device 80 as a response to a test write command to write a programmed sequence of test data bits to the cell array 60.

The test arrangement according to FIG. 4 contains, as reference module 20, a memory module which is constructed and produced in exactly the same way as the test specimens 10, so that a more detailed description of its details and its method of operation is unnecessary. The elements contained in the reference module 20 are designated by the same reference numerals as the corresponding elements in the test specimens 10. The reference module 20, which preferably originates from the same fabrication series as test specimens 10, has been found as an error-free exemplar that functions in an exemplary manner (commonly referred to as a "golden device") as a result of prior testing by means of a precision tester. The remaining component parts of the test arrangement according to FIG. 4 are described below in conjunction with the test mode.

A test control unit 90 is provided, which is connected to the command and address inputs 81 of all the modules 10, 20 via a branching command and address bus 91. The system of the bus branching is designed such that the same bus length results between the unit 90 and all the inputs 81, so that the signals supplied by the unit 90 arrive at the inputs 81 synchronously and with the same characteristics.

At the beginning of the test operation, firstly a test write mode is effected, triggered by a test write command supplied by the test control unit 90 (e.g., a test mode command followed by a write command). As a result of this, in the reference module 20 and in each test specimen 10, the same test pattern of data bits from the respectively assigned test pattern generator 30 is written to the respective cell array 50. The cell addressing is identical here at all the modules 10, 20 and is predefined by the address bits supplied by the test control unit 90.

After the test write mode, the test control unit 90 controls a test read mode, by transmitting a test read command with renewed transmission of address bits to read out the data written in the modules 10, 20, so that the read data signals appear simultaneously at the data terminals 71 of all the modules. For each data terminal 71 of each test specimen, the test arrangement includes a dedicated comparator 40 with an evaluation circuit 50 connected downstream. For reasons of clarity in the drawing, FIG. 4 illustrates only three comparators 40[*a*], 40[*b*], 40[*c*] and evaluation circuits 50[*a*], 50[*b*], 50[*c*] for the first of the n data terminals 71 of the three test specimens 10[*a*], 10[*b*], 10[*c*]. The first input of each comparator 40 is connected to the first data terminal 71 of the respectively assigned test specimen, and its second input is connected to the first data terminal 71 of the reference module 20. The line system between the comparators and the modules 10, 20 is configured such that all connections are of the same length or have the same propagation time and also have otherwise identical transmission properties. Consequently, the signals to be compared appear at the inputs of all the comparators at the same time.

The network of comparators 40 and evaluation circuits 50 depicted in FIG. 4 is provided in n-fold fashion overall, that is to say, in the same way also for the second, third, etc., data terminals of the test specimens 10 and of the reference module 20. Consequently, during the test read mode, all the data signals supplied by the test specimens 10, as actual responses to the test pattern, are compared with the assigned desired responses supplied by the reference module 20. As soon as one of the actual responses deviates from the relevant desired response by more than a predefined amount, the evaluation circuit 50 assigned to the relevant test specimen data terminal 71 generates an effective error signal F.

The evaluation circuits 50 may be designed and may function in a manner such as described above with reference to FIG. 2. The activation signal A required in this case may be generated in temporal reference with respect to a clock signal which also synchronizes the operation of the test specimens 10 and of the reference module 20. The clock lines used for this purpose are not depicted in FIG. 4 for reasons of clarity.

Figure 5:
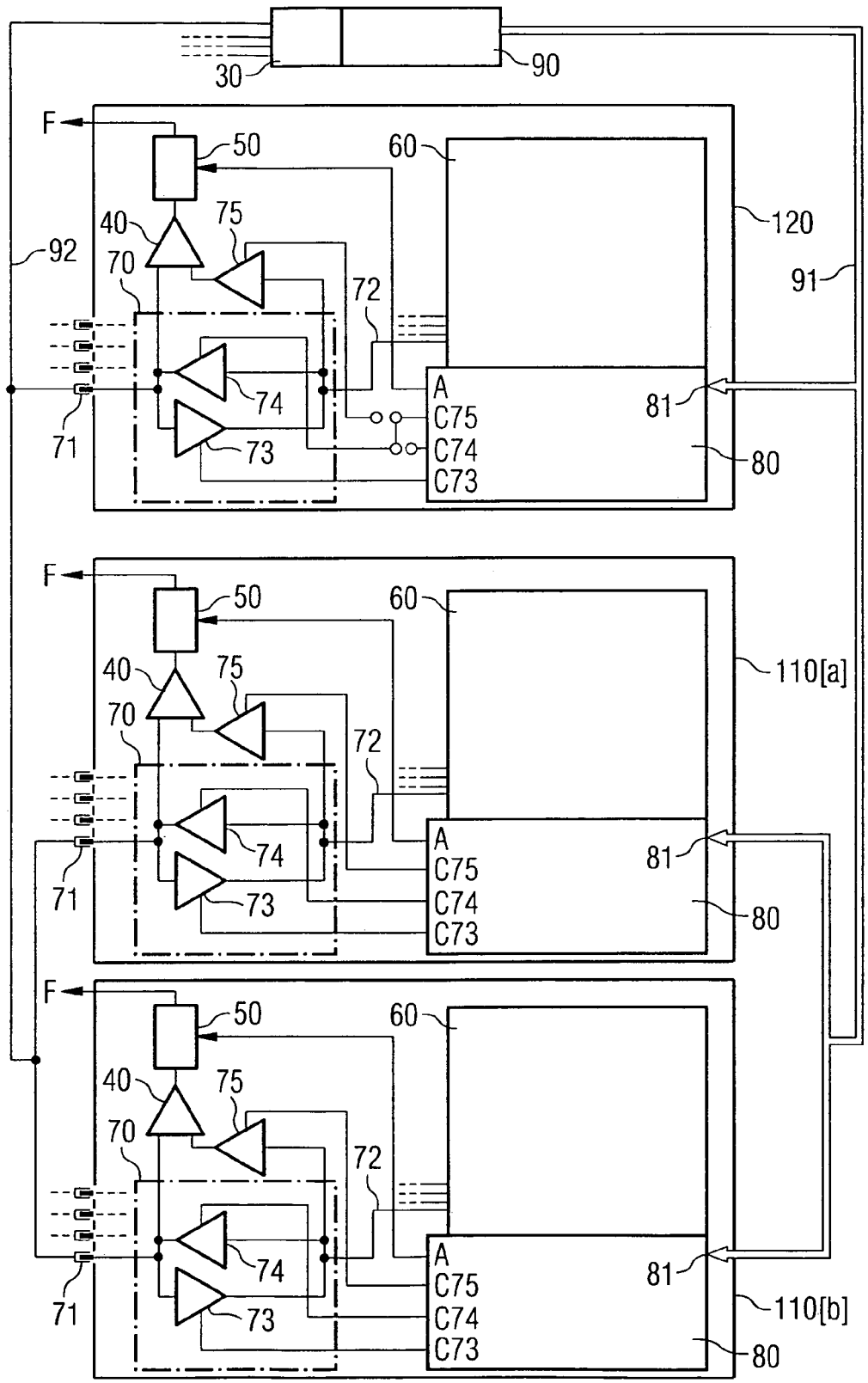
FIG. 5 shows the schematic diagram of a circuit arrangement for carrying out memory tests according to a second embodiment of the invention.

FIG. 5 shows an example of a test arrangement in which the comparison devices and evaluation circuits assigned to the test specimens are in each case an integrated component part of the test specimens themselves. Two test specimens 110[*a*] and 110[*b*] are illustrated, which are memory modules each containing a cell array 60 and a control device 80 with a command and address input 81 and having n data terminals 71 which are connected to the cell array 60 via an assigned bidirectional data port 70. The illustration depicts, in each test specimen 110, only one of the n data ports and the connection thereof to the assigned data terminal 71 and the cell array 60. The other data ports are formed in exactly the same way. In the normal write and read modes, the modules 110 illustrated in FIG. 5 operate in the same manner known as previously described with reference to FIG. 4.

FIG. 5 illustrates some details of the bidirectional data ports 70. Each data port 70 includes two antiparallel-connected transfer channels between the assigned data terminal 71 and an assigned data line 72 which is connected to the cell array 60. One transfer channel, which serves for transmitting received write data from the data terminal 71 to the data line 72, contains a reception data driver 73, which can be switched by a control signal C73 supplied by the control device 80 to switch on or to interrupt the "reception" transfer channel. The other transfer channel, which serves for transmitting read data to be transmitted from the data line 72 to the data terminal 71, includes a transmission data driver 74, which can be switched by a control signal C74 supplied by the control device 80 to switch on or to interrupt said "transmission" transfer channel.

To test the test specimens 110 shown in FIG. 5 in the manner according to the invention, each test specimen 110 includes, for each of its data ports 70, a test comparator 40 with evaluation circuit 50 connected downstream. The first input of the comparator 40 may be connected to the assigned data line 72 via a test data driver 75, which can be switched by a control signal C75 supplied by the control device 80. The second input of the comparator 40 is connected to the assigned data terminal 71.

The test arrangement shown in FIG. 5 includes, as reference module 120, a memory module which is constructed and produced in exactly the same way as the test specimens 110 (with a small difference in the wiring of the control signals, which is described further below) so that a more detailed description of its details and its method of operation is unnecessary. The elements contained in the reference module 120 are designated by the same reference numerals as the corresponding elements in the test specimens 110. The reference module 120, which preferably originates from the same fabrication series as the test specimens 110, has been found as an error-free exemplar that functions in an exemplary manner (i.e., a "golden device") as a result of prior testing by means of a precision tester. The remaining component parts of the test arrangement according to FIG. 5 are described below in conjunction with the test mode.

A test control unit 90 is provided, which is connected to the command and address inputs 81 of all the modules 110, 120 via a branching command and address bus 91. Furthermore, a test pattern generator 30 is provided having n data outputs which are connected, via a branching n-core "external" data bus 92, to the n data terminals 71 of both the test specimens 110 and the reference module 120. FIG. 5 illustrates only that core of the external data bus 92 which leads to a first data terminal 71 at each module 110, 120.

At the beginning of the test operation, firstly a test write mode is effected, triggered by a test write command supplied by the test control unit 90. As a result of this, in the reference module 120 and in each test specimen 110, the same test pattern of data bits from the respectively assigned test pattern generator 30 is written to the respective cell array 60. The cell addressing is identical here at all the modules 110, 120 and is predefined by the address bits supplied by the test control unit 90. During the test write mode, in each module 110, 120, the reception data drivers 73 are switched on by the control signal C73, and the transmission data drivers 74 and the test data drivers 75 remain switched off.

After the test write mode, the test control unit 90 controls a test read mode, by transmitting a test read command with renewed supply of address bits to read out the data written in the modules 110, 120. During the test read mode, in the test specimens 110, the reception data drivers 73 and the transmission data drivers 74 remain switched off, and the test data drivers 75 are switched on by the control signal C75. In the reference module 120, however, the transmission data drivers 74 are switched on, and the reception data drivers 73 and the test data drivers 75 remain switched off. This control difference between reference module and test specimens in the test read mode can be realized, e.g., by means of the control signal C75, which is applied to the test data drivers 75 in the test specimens 110, being applied to the transmission data driver 74 in the reference module 120. The corresponding different signal routing can be effected by simple manipulation on the finished reference module 120 prior to its encapsulation, e.g., by means of metallization or fuse technology.

During the test read mode, then, the data which are read out from the reference module 120 representing the desired responses to the test pattern pass via the transmission data drivers 74 of the reference module and the data bus system 92 to the data terminals 71 of each test specimen 110 and from there to the second inputs of the respectively assigned comparators 40. The data signals which are read out in the test specimens 110 and represent the actual responses of the test specimens to the test pattern pass via the test data drivers 75 to the first inputs of the comparators 40. As soon as an actual response deviates from the relevant desired response by more than a predetermined amount, the evaluation circuit 50 assigned to the relevant test specimen data terminal 71 generates an effective error signal F.

In the case of the design of the test specimens 110 which is shown in FIG. 5, possible malfunctions of the transmission data drivers 74 in the test specimens 110 do not become apparent during the test according to one embodiment of the invention since these elements are not active either during the test write mode or during the test read mode. An alternative design in which this problem does not occur is illustrated in FIG. 6.

Figure 6:
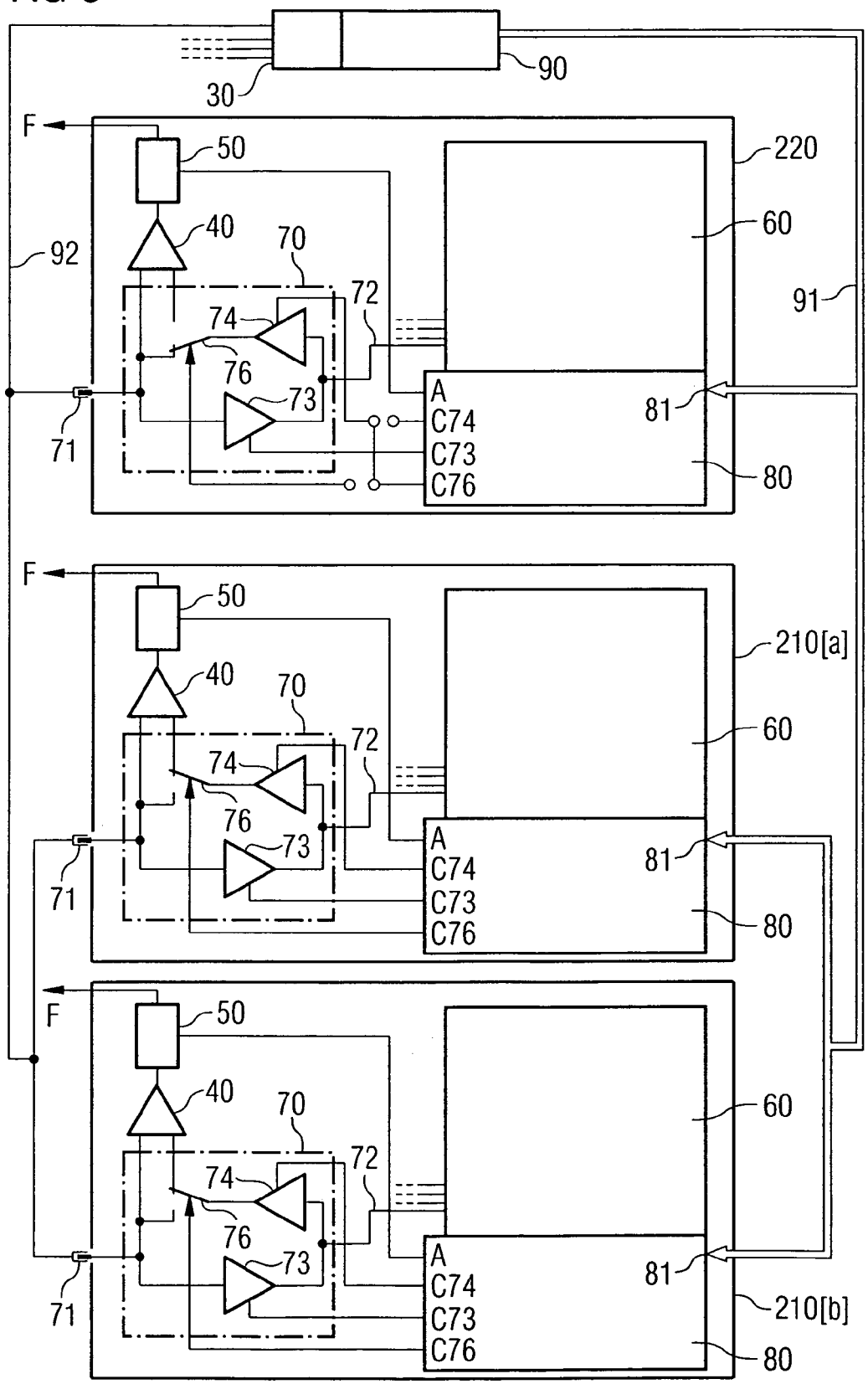
FIG. 6 shows the schematic diagram of a circuit arrangement for carrying out memory tests according to a third embodiment of the invention.

The arrangement according to FIG. 6 differs from the arrangement according to FIG. 5 by virtue of a small modification on the test specimens, which are designated by the reference numeral 210 in FIG. 6. This modification consists in the provision of a changeover switch 76 at the output of the transmission data driver 74 in each data port 70 of the test specimens 210. The changeover switch may be controlled by a control signal C76 supplied by the control device 80 to connect the driver output either to the assigned data terminal 71 or to the first input of the assigned comparator 30. The test data drivers 75 present in the test specimens 110 according to FIG. 5 are absent in the test specimens 210 according to FIG. 6. The reference module 220 shown in FIG. 6 is a successfully tested module from the same production series as the test specimens 210.

In all other circuitry features, the arrangement according to FIG. 6 resembles that according to FIG. 5. The test mode is effected in a manner similar to that described above with reference to FIG. 5, with the sole difference that the control signal C76 replaces the control signal C75, in the test read mode, to bring the changeover switches 76 in the test specimens 210 into the switching state (depicted in bold) and thereby to decouple the output of each transmission data driver 74 from the assigned external data terminal 71 and instead to connect it to the first input of the assigned comparator 30. Consequently, during the test read mode, the data signals read from the cell array 60 of each test specimen 210, as actual responses, pass through the same transmission data drivers as the data signals read out in useful operation. A malfunction of these data drivers is thus identified during testing. The changeover switches 76, depicted symbolically like mechanical switches in FIG. 6, are in practice electronic changeover devices having a short response time (e.g., 1-to-2 multiplexers). Their transfer time may, if necessary, be compensated for by insertion of a corresponding compensating delay (not shown) at the second input of each comparator 40.

The changeover switches 76 in the data ports 70 of the test specimens 210 may be kept in the state depicted bold during the test write mode as well, because the transmission data drivers 74 remain switched off anyway in this time. The other state, depicted in dashed fashion, of the changeover switches 76 is actually only necessary during normal operation of the successfully tested test specimens to transmit read-out data signals to the external data terminals 71. In the data ports 70 of the reference module 220, the outputs of the transmission data drivers 74 have to be connected to the assigned external data terminals 71 at least during the test read mode. Since this connection is permitted to exist during the test write mode as well, it may be designed as a permanent connection, e.g., by fixed latching of the changeover switch 76 in the corresponding state or by bridging of the changeover switch. This may be effected by means of simple manipulation on the finished reference module 220 prior to its encapsulation, e.g., by means of fuse technology or metallization.

The evaluation circuits 50 in the test specimens 110 according to FIG. 5 and 210 in FIG. 6 may be designed and may function in a manner such as previously described with reference to FIG. 2. The activation signal A required in this case may be generated by the respectively assigned control device 80 in temporal reference with respect to a clock signal which also synchronizes the operation of the test specimens and of the reference module. The clock lines used for this purpose are not depicted in FIGS. 5 and 6 for reasons of clarity.

In the arrangements according to FIG. 5 and FIG. 6, the branching system of the command and address bus 91 and of the external data bus 92 is configured such that the following time conditions are met:

a) the data signals supplied by the test pattern generator 30 in the test write mode should, at each module (test specimens and reference module), be in the same temporal relationship with the command and address signals received there; and b) the data signals supplied by the reference module 120 or 220 in the test read mode should, at each comparator 40 in each test specimen 110 or 210, be in the same temporal relationship with the command and address signals as the data signals read out in the relevant test specimen itself.

Additional compensating delays may be inserted as required at suitable locations to meet these time conditions exactly.

In test methods according to the invention and arrangements for carrying out memory tests, the order of the addresses for addressing the memory cells in the test read mode may be identical to or different than in the test write mode. It is also possible, after a test write mode, to carry out a plurality of complete test read cycles with different orders of addresses to test the behavior of the memory modules more intensively.

While the foregoing is directed to embodiments of the present invention, other and further embodiments of the invention may be devised without departing from the basic scope thereof, and the scope thereof is determined by the claims that follow.

What is claimed is:

1. A method for testing electrical modules, comprising:
applying a test pattern of input signals to each module;
applying the same test pattern to a reference module, wherein the reference module is of the same design and technology as the electrical modules being tested;
wherein each electrical module and the reference module are digital data memories each containing a multiplicity of addressable memory cells and having data ports to input data bits to be stored in a write mode and to output stored data bits in a read mode;
wherein each data port in the electrical modules and in the reference module comprises a bidirectional port arranged between an assigned external data terminal and an assigned internal data line, the bi-directional port comprising:
a reception transfer channel that can be switched on selectively for data bits to be written;
a transmission transfer channel that can be switched on selectively for reading-out data bits; and
a switching device provided for each data port in each electrical module, wherein the switching device, in a first switching state, switches on the reception transfer channel and inhibits the transmission transfer channel and, in a second switching state, switches on the transmission transfer channel and inhibits the reception transfer channel, wherein the switching device is changeable into a third state in which the reception transfer channel and the transmission transfer channel remain interrupted, the internal data line remain connected to the actual response input of the assigned comparator and the external data terminal remain connected to the desired response input of the assigned comparator;
wherein the test pattern comprises data bits that are applied together with a write command and with addressing signals to the electrical modules and to the reference module to write the data bits to addressed memory cells of both the reference module and the electrical modules;
wherein the test patterns are applied utilizing a common test control unit, which, for writing in the data bits of the test pattern, applies the same pattern of write addressing signals for the selection of the memory cells to each electrical module and to the reference module, and for reading from the memory cells filled with the data bits of the test pattern, applies the same pattern of read addressing signals to each electrical module and to the reference module;
comparing, utilizing a comparison device, actual responses of each module to the test pattern with desired responses to the test pattern provided by the reference module, wherein the comparing produces a comparison result, wherein the comparison device includes a comparator for each data port of the electrical module, wherein the comparator compares a signal appearing at a relevant data port of the respective electrical module as actual response with the desired response at the corresponding data port of the reference module; and
evaluating the comparison result to produce a test assessment.

2. The method of claim 1, wherein the comparison result is determined by a time integral of a magnitude of an amplitude difference between the actual response and the desired response over a selected integration duration.

3. The method of claim 2, further comprising:
indicating the test assessment as not passed if a value of the time integral determined is higher than a preselected threshold value.

4. The method of claim 1, wherein the reference module has been previously tested utilizing a precision test device.

5. A circuit arrangement for testing electrical modules, comprising:
a test pattern generator for generating a preselected test pattern of input signals for each electrical module to be tested;
a reference module that is produced with same design and technology as the electrical modules and tested as entirely satisfactory configured to receive the preselected test pattern and supply desired responses to the preselected test pattern;
wherein each electrical module and the reference module are digital data memory circuits each containing a multiplicity of addressable memory cells and having data ports to input data bits to be stored in a write mode and to output stored data bits in a read mode,
wherein the test pattern generating device is configured to generate the test pattern as a pattern of data bits for writing to the memory cells, and
wherein each data port in the electrical modules and in the reference module comprises a bidirectional port arranged between an assigned external data terminal and an assigned internal data line, the bi-directional port comprising:
a reception transfer channel that can be switched on selectively for data bits to be written;
a transmission transfer channel that can be switched on selectively for reading-out data bits; and
a switching device provided for each data port in each electrical module, wherein the switching device, in a first switching state, switches on the reception transfer channel and inhibits the transmission transfer channel and, in a second switching state, switches on the transmission transfer channel and inhibits the reception transfer channel, wherein the switching device is changeable into a third state in which the reception transfer channel and the transmission transfer channel remain interrupted, the internal data line remain connected to the actual response input of the assigned comparator and the external data terminal remain connected to the desired response input of the assigned comparator;
a comparison device for comparing actual responses to the test pattern by the electrical modules with the desired responses, wherein the comparison device includes a comparator for each data port of the electrical module, wherein the comparator compares a signal appearing at a relevant data port of the respective electrical module as actual response with the desired response at the corresponding data port of the reference module;
an evaluation device connected to the comparison device for supplying test assessments in a manner dependent on the comparison results; and
a common test control unit, which, for writing in the data bits of the test pattern, applies the same pattern of write addressing signals for the selection of the memory cells to each electrical module and to the reference module, and for reading from the memory cells filled with the data bits of the test pattern, applies the same pattern of read addressing signals to each electrical module and to the reference module.

6. The circuit arrangement of claim 5, wherein the evaluation device is configured to determine a time integral of a magnitude of an amplitude difference between each respective actual response and desired response over a selected integration duration.

7. The circuit arrangement of claim 6, wherein the evaluation device generates an error signal when a value of the time integral determined is higher than a preselected threshold value.

8. The circuit arrangement of claim 5, wherein the test pattern generating device comprises a separate test pattern generator for each electrical module and for the reference module.

9. The circuit arrangement of claim 8, wherein the test pattern generators are integrated in the electrical modules and in the reference module.

10. The circuit arrangement of claim 5, wherein the test pattern generating device comprises a single common test pattern generator for the electrical modules and the reference module.

11. The circuit arrangement of claim 5, wherein each external data terminal is fixedly connected to the desired response input of the assigned comparator.

12. The circuit arrangement of claim 11, wherein each reception transfer channel comprises a reception data driver that can be switched on and off and each transmission transfer channel comprises a transmission data driver that can be switched on and off, further comprising:

a test data driver that can be switched on and off arranged between each internal data line and the actual response input of the assigned comparator, wherein the switching device includes a switching control device which, in response to a write command, generates first switching signals for switching on the reception data drivers and, in response to a read command, generates second switching signals for switching on the transmission data drivers and, in response to a test read command, generates third switching signals for switching on the test data drivers.

13. The circuit arrangement of claim 11, wherein each reception transfer channel comprises a reception data driver that can be switched on and off and each transmission transfer channel comprises a transmission data driver that can be switched on and off, wherein the switching device, in each data port, comprises:

a changeover switch which, in a first state, connects the output of the transmission data driver to the external data terminal and, in a second state, connects the output of the transmission data driver to the actual response input of the assigned comparator, and a switching control device, which, in response to a write command, generates first switching signals for switching on the reception data drivers and, in response to a read command, generates second switching signals for switching on the transmission data drivers and for setting the changeover switches into the first state and, in response to a test read command, generates third switching signals for switching on the transmission data drivers and for setting the changeover switches into the second state.

14. The circuit arrangement of claim 11, wherein the switching control device is integrated within each respective electrical module.

15. The circuit arrangement of claim 5, wherein the comparators are integrated in the electrical modules.

16. The circuit arrangement of claim 15, wherein the evaluation device, for each comparator, includes a separate evaluation circuit integrated in each respective electrical module.

* * * * *